United States Patent
Tsai et al.

(10) Patent No.: US 8,258,762 B2
(45) Date of Patent: Sep. 4, 2012

(54) COMPUTER POWER MEASUREMENT DEVICE

(75) Inventors: Tung Jung Tsai, Taipei Hsien (TW); Yu Tsung Kao, Taipei Hsien (TW); Chien Chi Hsu, Taipei Hsien (TW)

(73) Assignee: MSI Computer (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 13/010,722

(22) Filed: Jan. 20, 2011

(65) Prior Publication Data
US 2011/0119003 A1   May 19, 2011

Related U.S. Application Data

(62) Division of application No. 11/871,861, filed on Oct. 12, 2007, now Pat. No. 7,898,225.

(30) Foreign Application Priority Data

Apr. 14, 2007   (TW) .............................. 96113246 A

(51) Int. Cl.
*G05F 1/00* (2006.01)
(52) U.S. Cl. ....................................... 323/222; 323/282
(58) Field of Classification Search .................. 323/222, 323/232, 266, 271, 275, 282
See application file for complete search history.

(56) References Cited

U.S. PATENT DOCUMENTS

| | | | | |
|---|---|---|---|---|
| 6,218,652 | B1 * | 4/2001 | Kim et al. ...................... | 219/721 |
| 6,473,280 | B1 * | 10/2002 | Buxton et al. .................. | 361/18 |
| 6,650,096 | B2 | 11/2003 | Lee | |
| 6,936,192 | B2 * | 8/2005 | Urano ............................ | 252/512 |
| 7,626,369 | B2 * | 12/2009 | Schoofs et al. ............... | 323/282 |
| 2005/0156583 | A1 * | 7/2005 | Nachamiev et al. .......... | 323/283 |
| 2006/0125452 | A1 * | 6/2006 | Hsieh et al. ................... | 323/234 |
| 2008/0111517 | A1 * | 5/2008 | Pfeifer et al. ................. | 320/101 |

FOREIGN PATENT DOCUMENTS

| | | |
|---|---|---|
| TW | 480380 | 3/2002 |
| TW | 529228 | 4/2003 |
| TW | M302956 | 12/2006 |

* cited by examiner

*Primary Examiner* — Nguyen Tran

(57) ABSTRACT

The present invention provides a computer power measurement device, which comprises: a first inductor connected power supply, and the first inductor is provided with a first DC equivalent resistance; a second inductor connected power consumption components, and the second inductor is provided with a second DC equivalent resistance; an input measurement module, which is connected to the first inductor, and measures the input power based on the first DC equivalent resistance; and, an output measurement module, which is connected to the second inductor, and measures the output power based on the second DC equivalent resistance.

9 Claims, 4 Drawing Sheets

COMPUTER POWER MEASUREMENT DEVICE

CROSS-REFERENCES TO RELATED APPLICATIONS

This application is a divisional of U.S. application Ser. No. 11/871,861, filed Oct. 12, 2007, the entire disclosure of which is hereby incorporated by reference.

This non-provisional application claims priority under 35 U.S.C. §119(a) on Patent Application No(s). 096113246 filed in Taiwan, R.O.C. on Apr. 14, 2007, the entire contents of which are hereby incorporated by reference.

FIELD OF INVENTION

The present invention relates to a power measurement device, and particularly to a computer power measurement device.

BACKGROUND

As for the operational speed of the computer is increasing, the power consumption is also increasing accordingly. Also, because the operational speed of computer components is faster and faster, the required power consumption is increased. The power supply is the power source for computer. Because sometimes the output power from the power supply could not afford the total requirement of the power consumption components in the computer, it will cause the system instability, and even cause the damages to the power supply. Thus, there are many information related manufacturers emphasizing the energy efficiency of the power supply, and there presented many devices and methods for measuring computer performance.

The conventional measurement device for computer performance employs the method for cascading an external resistor at one end of computer for the input of the power supply, and by measuring the current and voltage for the resistor to convert into the input power of the power supply. On the opposite, the end at the motherboard or other computer components, such as CPU and memory, would be cascaded with an external resistor additionally, and, similarly, by measuring the current and voltage for the resistor to convert into the output power. However, either the power supply or the computer components being cascaded with an external resistor, it would have changed the original circuit structure of the computer device, and the additional external resistor would cause the voltage drop at both ends of the resistor, and generate the excess energy consumption. Therefore, the measured computer performance would have lower precision, and limited reference value.

There is another kind of conventional measurement device for computer performance, which emphasized for measuring the total output power of the power supply, and the measured resistance for the resistor would be far less than the impedance of the computer motherboard. However, the method is required to add one more power adapter card between the power supply and the motherboard; and, connecting the power supply to the power adapter card, and connecting the power adapter card to the motherboard to supply the power for the computer operation; and, the resistor for power measurement is located on the power adapter card. The disadvantage for this method is that it is required to add a power adapter card, which caused the increased cost.

SUMMARY

In view of these above-mentioned, the present invention provides a computer power measurement device, which needs no additional cascaded external resistor, and would not change the original circuit structure of the computer device, and would not cause excess energy consumption causing errors on power measurement, and needs not to add a power adapter card in the computer device, thus it would not increase the additional cost.

The present invention provides a computer power measurement device, which comprises: a first inductor connected power supply, and the first inductor is provided with a first DC equivalent resistance; a second inductor connected power consumption components, and the second inductor is provided with a second DC equivalent resistance; an input measurement module, which is connected to the first inductor, and measures the input power based on the first DC equivalent resistance; and, an output measurement module, which is connected to the second inductor, and measures the output power based on the second DC equivalent resistance.

The present invention also provides a computer power measurement device, which comprises: a motherboard, which includes at least one input unit and one output unit, and the input unit is electrically connected to the output unit, and each of the input units is connected to the power supply, respectively, and the output unit is connected with a plurality of energy consumption components; at least one impedance with one end connected to the input unit, and the other end connected to the output unit; a plurality of inductors, which are connected with the energy consumption components, and each inductor is provided with a DC equivalent resistance; an input measurement module, which is connected to the impedance, and measures the input power based on the resistance of the impedance; and, an output measurement module, which is connected to the inductor, and measures the output power supplied to each energy consumption component based on the DC equivalent resistance of each inductor.

The preferred embodiments and the effects related to the present invention are described associated with the figures as follows.

DETAILED DESCRIPTION

Figure 1:
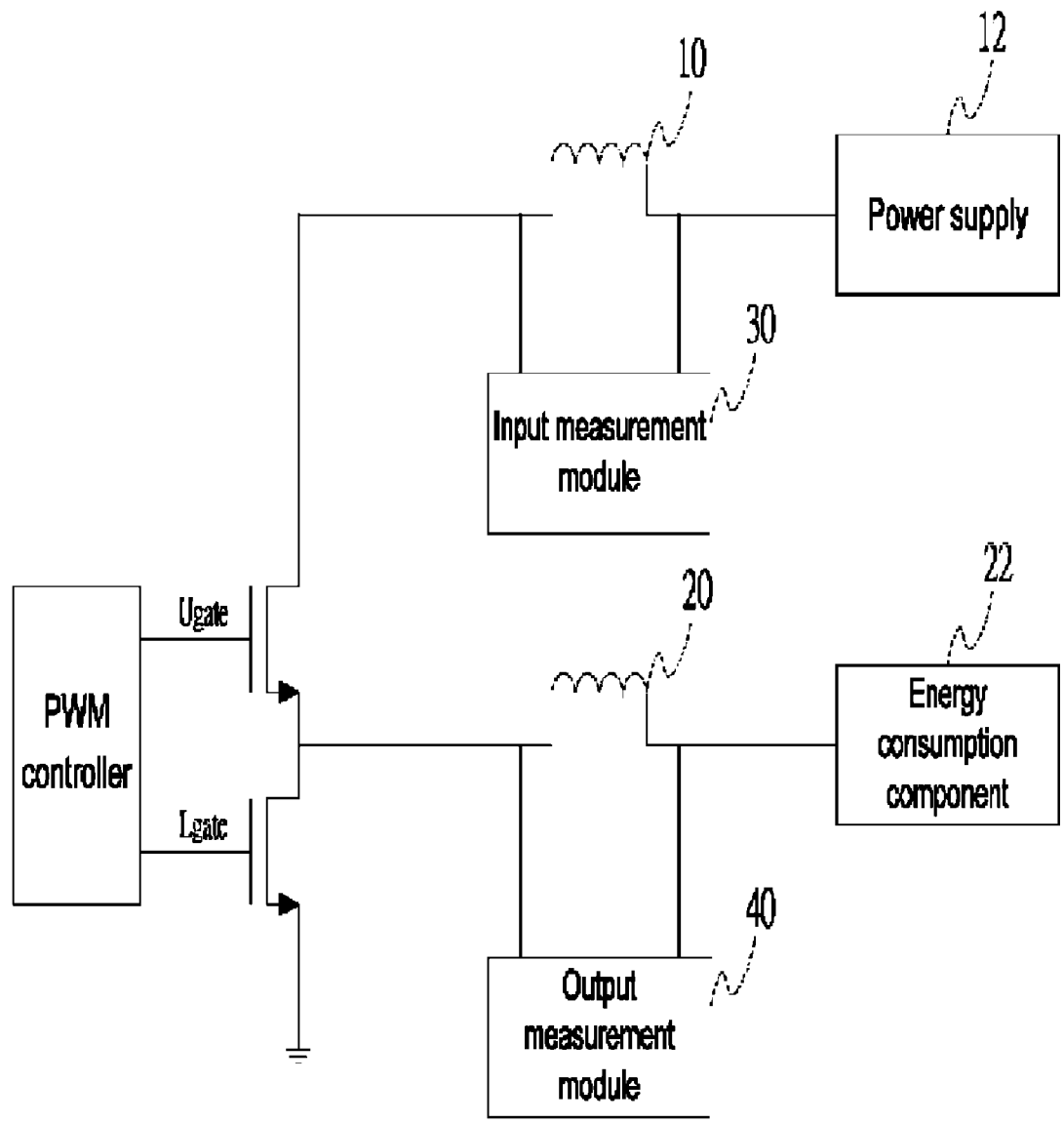
FIG. 1 is a first embodiment of the computer power measurement device according to the present invention.

Referring to FIG. 1, it shows a first embodiment of the computer power measurement device according to the present invention. The computer power measurement device according to the present invention comprises: a first inductor 10, a second inductor 20, an input measurement module 30, and an output measurement module 40.

First, the left of FIG. 1 is configured with a PWM (Pulse Width Modulation) controller, in which two MOS switches and the PWM controller are connected together. The main function of the PWM controller is to control the high gate control signal (Ugate) and the low gate control signal (Lgate). Thus, the method could control the ON or OFF states for the two MOS switches, so the power supply 12 could supply the electricity to the energy consumption components 22. This kind of power supply status belongs to the switch power. Under such state, the circuit between the power supply 12 and the PWM controller is provided with an inductor. Similarly, the circuit between the energy consumption components 22 and the PWM controller is also provided with an inductor, wherein the function of the inductor in the circuit could be used as circuit isolation.

Based on the above description, the first inductor 10 is different from the cascaded external resistor in the prior art. The first inductor 10 according to the present invention is the existing inductor in the circuit of the computer device; wherein, the first inductor 10 is connected to the power supply 12, and the first inductor 10 is provided with a first DC equivalent resistance (DCR). The input measurement module 30 is connected to the first inductor 10, and measures the input power based on the first DC equivalent resistance. According to the Ohm's rule V=IR, the first DC equivalent resistance (R) of the first inductor 10 is known, and, by measuring the crossed voltage (V) at both ends of the first inductor 10, the current (I) from the power supply 12 could be obtained. With the formula of power P=VI, the input power supplied by the power supply 12 could be calculated. Because the first inductor 10 is the existing inductor in the circuit, using the first DC equivalent resistance of the first inductor 10 itself for measuring the input power would not like the prior art generating the excess energy consumption due to the cascaded external resistor changing the existed circuit structure. Thus, the input power measured by the computer power measurement device according to the present invention would be more precise than that measured by the measurement method in the prior art, and have simple circuit and lower cost.

Similarly, the second inductor 20 is also the existing inductor in the circuit of the computer device, which is located at one end of the energy consumption component 22; wherein, the second inductor 20 is connected to the energy consumption component 22, and the second inductor 20 is provided with a second DC equivalent resistance, in which the energy consumption components 22 are various power consumption components in the computer equipment, such as central processing unit (CPU), memory, south bridge chip or north bridge chip, and the like. The output measurement module 40 is connected to the second inductor 20, and measures the output power based on the second DC equivalent resistance. The method for measuring the output power also employs the Ohm's rule, V=IR, and the second DC equivalent resistance (R) of the second inductor 20 is known, so, by measuring the crossed voltage (V) at both ends of the second inductor 20, the current (I) outputted to the energy consumption component 22 could be obtained. With the formula of Power P=VI, the output power outputted to the energy consumption components 22 could be calculated. Thus, with the second DC equivalent resistance of the second inductor 20 existed in the circuit for measuring the output power, the measured output power could be more precise than that measured by the conventional method with cascaded external resistor.

Figure 2:
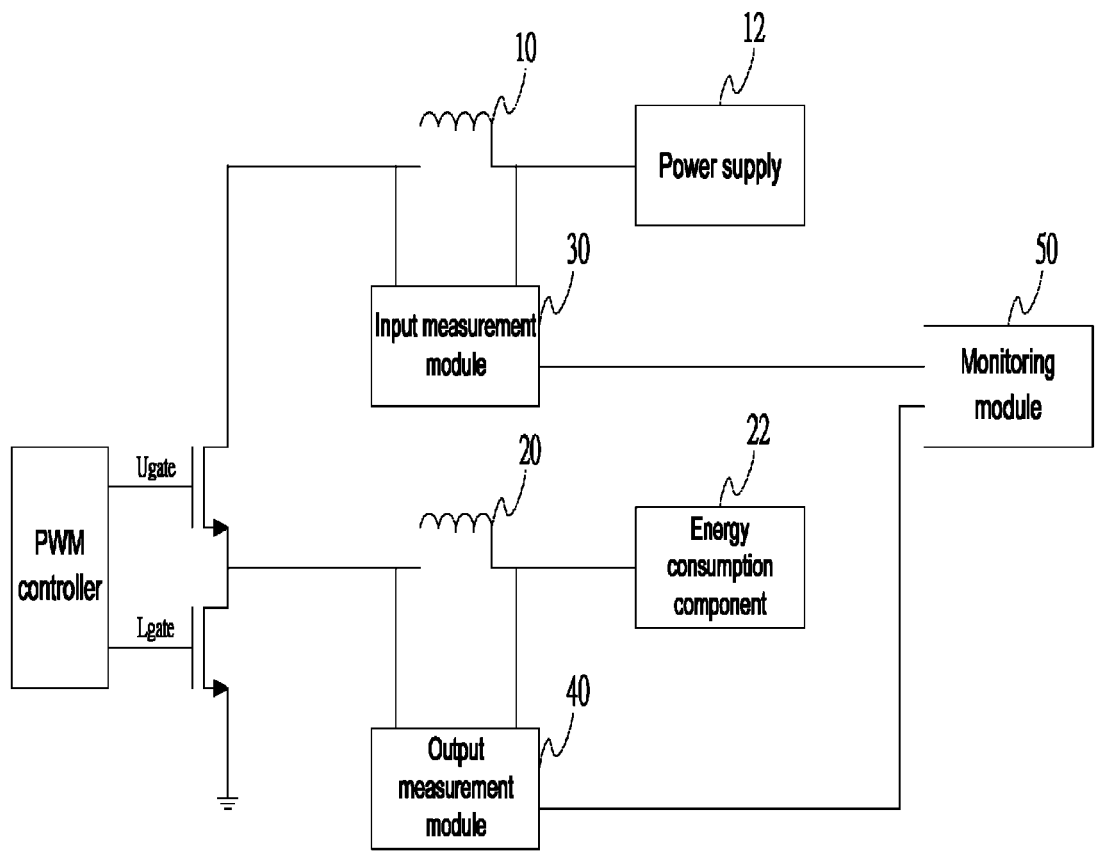
FIG. 2 is a second embodiment of the computer power measurement device according to the present invention.

Referring to FIG. 2, it shows a second embodiment of the computer power measurement device according to the present invention, in which the embodiment is added with a monitoring module 50. The monitoring module 50 is connected to the input measurement module 30 and the output measurement module 40 for displaying the input power and the output power. Thus, the input power measured and calculated by the input measurement module 30, and the output power measured and calculated by the output measurement module 40 could be displayed through the monitoring module 50. For example, the monitoring module 50 could be a monitor, and the computer user could easily obtain the input power for a certain energy consumption component 22, such as CPU, from the current power supply 12 on the monitor, and also the consumed power by the energy consumption component 22 relatively. Therefore, the real-time performance of the power supply 12 and the energy consumption components 22 could be obtained, and also be convenient for the user to understand the level of electricity efficiency supplied to the energy consumption components 22 by power supply 12.

Figure 3:
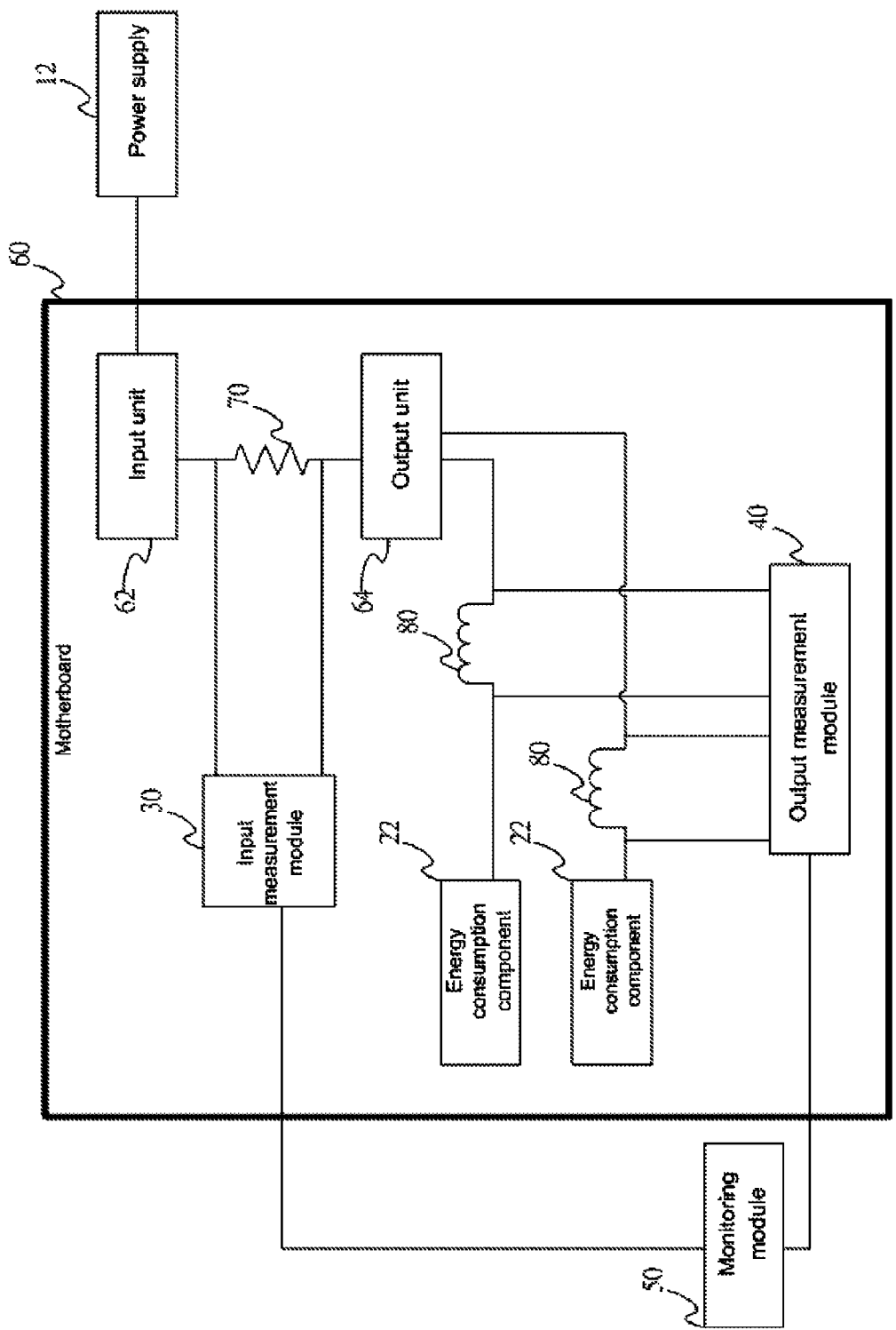
FIG. 3 is a third embodiment of the computer power measurement device according to the present invention; and, FIG. 4 is a fourth embodiment of the computer power measurement device according to the present invention.

Referring to FIG. 3, it shows a third embodiment of the computer power measurement device according to the present invention, wherein the computer power measurement device is added with a motherboard 60 and an impedance 70.

In the third embodiment, the motherboard 60 comprises an input unit 62 and an output unit 64; wherein, the input unit 62 and the output unit 64 are electrically connected to each other, and the input unit is connected to the power supply 12, and the output unit 64 is connected to a plurality of energy consumption components 22. The energy consumption components 22 are various components consuming power in the computer equipment, such as central processing unit (CPU), memory, south bridge chip or north bridge chip and the like. In the embodiment, the power supply 12 is first connected to the input unit 62 on the motherboard 60, and employing the output unit 64 supplying the power of the power supply 12 to all the energy consumption components 22 in the computer.

One end of the impedance 70 is connected to the input unit 62, and the other end is connected to the output unit 64. The input measurement module 30 is connected to both ends of the impedance 70, and measures the input power based on the resistance of the impedance 70. The method for measuring and calculating the input power by the input measurement module 30 is the same as the above, which would not be described herein. Because the impedance 70 is connected between the input unit 62 and the output unit 64, it is equivalent to endure the full power inputted from the power supply, so that the impedance 70 should be a high power impedance (with higher current capacity), and could employ the concrete resistor. Although the concrete resistor could endure higher power, the precision of impedance is not sufficient. Instead of the concrete resistor, the impedance 70 could employ the Mn—Cu wire. Because the Mn—Cu wire has the feature of fixed impedance, the input power measured and calculated by the input measurement module 30 with the resistance of Mn—Cu wire could be more precise than that employing concrete resistor.

An inductor 80 is connected between each energy consumption component 22 and the output unit 64, and each inductor is provided with a DC equivalent resistance; wherein, the inductor 80, as above mentioned, is also the existing inductor in the circuit of the computer device. The output measurement module 40 is connected at both ends of the inductor 80, and measures the output power supplied to each power consumption component 22 based on the DC equivalent resistance of each inductor. In the embodiment, it also comprises a monitoring module 50 connected to the input measurement module 30 and the output measurement module 40 for displaying the input power and the output power. The user could easily understand if the output power provided by the entire power supply 12 from the monitoring module 50 is enough to the usage of all energy consumption components 22, which could prevent the insufficient power of the power supply 12, and influence on the computer stability. Because the output measurement module 40 has measured the output power for all energy consumption components, the user could employ the monitoring module 50 to select and check the output power for different energy consumption components 22, such as selecting CPU mode for obtaining the output power supplied to the CPU in real-time, and selecting memory mode for obtaining the output power supplied to the memory in real-time.

The difference of the third embodiment to the first embodiment is that the input power measured in the first embodiment is the input power of the power supply 12 for a certain single energy consumption component 22, such as the input power of the power supply 12 to the CPU individually. But, in the third embodiment, the measured input power is the whole input power from the power supply 12 to the computer device.

Figure 4:
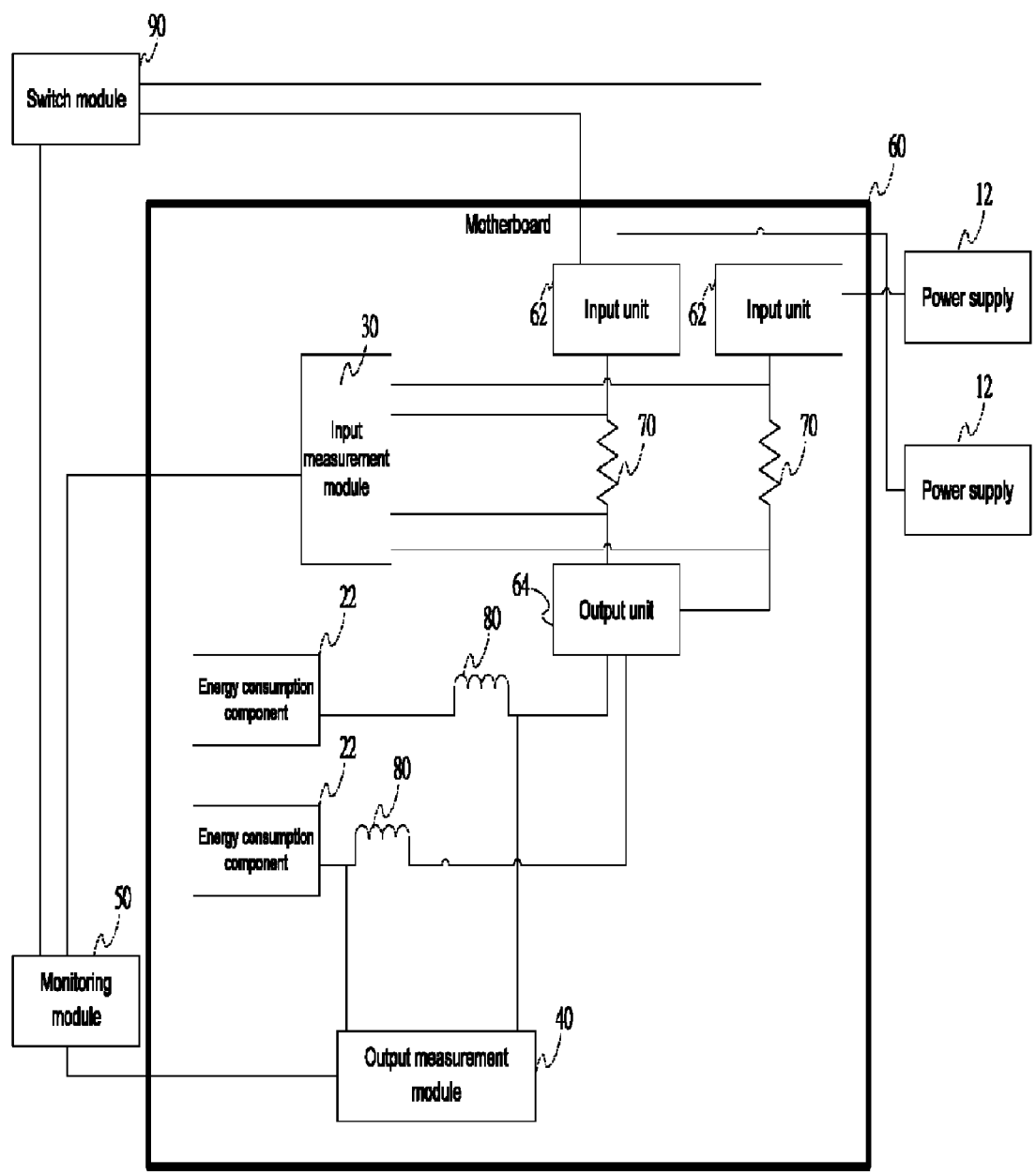

Referring to FIG. 4, it is a fourth embodiment of the computer power measurement device according to the present invention. In the embodiment, the motherboard 60 comprises a plurality of input units 62, and each of the input units 62 is connected to a power supply 12, respectively. The object of having a plurality of power supplies is that the excess power supplies 12 could be used as redundant. Thus, the embodiment is provided with a switch module 90 additionally, which is electrically connected to the monitoring module 50 and the plurality of input units 62. When the input power is less than the output power, it means that the originally connected power supply 12 could not afford the power requirement of all energy consumption components 22 in the computer. At this time, there must be a new power source to supply to the computer device in real-time, otherwise the computer device would crash. Thus, under such circumstance, the switch module 90 would send an enable signal to activate another input unit 62 and another power supply 12. Therefore, it could prevent the situation that because the power consumption of the energy consumption components 22 is too large to cause the computer crash or the damage to the power supply 12, so as to maintain the stability of computer operation.

The present invention have been described in details with the preferred embodiments as above, and these disclosed embodiments are not used to limit the scope of the present invention. Some alterations and modifications can be made by the persons skilled in the art without departing the spirit of the present invention and these alterations and modifications are all included in the scope of the present invention. Thus, the patent protection scope for the present invention should be defined by the attached claims of the application.

What is claimed is:

1. A computer power measurement device, which comprises:
   a motherboard, which includes a first input unit and an output unit, wherein the first input unit is electrically connected to the output unit, the first input unit is connected a first power supply, and the output unit is connected with a plurality of energy consumption components;
   an impedance, with one end connected to the first input unit and the other end connected to the output unit;
   a plurality of inductors, each of which are connected to a respective one of the energy consumption components, wherein each of the inductors is provided with a DC equivalent resistance;
   an input measurement module, which is connected to the impedance in parallel, and is configured to measure the crossed voltage at both ends of the impedance and calculate an input power according to a value of the resistance of the impedance and the measured cross voltage of the impedance; and,
   an output measurement module, which is connected to each of the inductors in parallel, and is configured to measure the crossed voltage at both ends of the inductors and calculate an output power supplied to each energy consumption component according to a value of the DC equivalent resistance of each inductor and the measured cross voltage of each inductor.

2. A computer power measurement device according to claim 1, wherein the energy consumption component is a central processing unit (CPU).

3. A computer power measurement device according to claim 1, wherein the energy consumption component is a memory.

4. A computer power measurement device according to claim 1, wherein the energy consumption component is a south bridge chip.

5. A computer power measurement device according to claim 1, wherein the energy consumption component is a north bridge chip.

6. A computer power measurement device according to claim 1, wherein the impedance is a concrete resistor.

7. A computer power measurement device according to claim 1, wherein the impedance is a Mn—Cu wire.

8. A computer power measurement device according to claim 1, which further comprises a monitoring module, which is connected to the input measurement module and the output measurement module for displaying the input power and the output power.

9. A computer power measurement device according to claim 1, wherein the motherboard further comprises a second input unit, which is connected to a second power supply, and the computer power measurement device further comprises a switch module configured to send an enable signal to activate the second input unit and the second power supply when the input power is less than the output power.

* * * * *